United States Patent [19]

Muto et al.

[11] Patent Number: 5,093,615
[45] Date of Patent: Mar. 3, 1992

[54] MOVEMENT FOR AN INSTRUMENT HAVING AN ELECTROMAGNETIC CONTROL ARRANGEMENT

[75] Inventors: Masanori Muto; Katsumi Kato; Yukio Ohike; Sadayuki Okamoto, all of Shimada, Japan

[73] Assignee: Yazaki Corporation, Tokyo, Japan

[21] Appl. No.: 493,523

[22] Filed: Mar. 14, 1990

[30] Foreign Application Priority Data

Mar. 16, 1989 [JP] Japan .................................. 1-62150

[51] Int. Cl.⁵ .................................. G01R 1/20
[52] U.S. Cl. .................................. 324/146; 324/151 A; 324/144
[58] Field of Search ........... 324/143, 144, 146, 151 R, 324/151 A, 154 R, 154 PB, 155

[56] References Cited

U.S. PATENT DOCUMENTS 3,794,868 2/1974 Haigh .................... 324/146 X
4,492,920 1/1985 Reenstra .................. 324/146

FOREIGN PATENT DOCUMENTS 0036563 2/1987 Japan .................... 324/146
62-59869 4/1987 Japan .

Primary Examiner—Jack B. Harvey
Attorney, Agent, or Firm—Armstrong, Nikaido, Marmelstein, Kobovcik & Murray

[57] ABSTRACT

A movement for instrument is of thin construction. A rotatably supported shaft extends through a thin magnet and supports the magnet on it. The magnet radiates a magnetic field that varies in magnetic field strength in accordance with a sine function along a circular path about the shaft. A signal generator provides a first current and a second current. First straight conductors are disposed in a first direction parallel to the surface of the thin magnet, are laid in the magnetic field of the magnet, and are supplied with the first current through them. Second straight conductors are disposed in a second direction parallel to the surface of the magnet and transverse to the first direction. The second conductors are laid in the magnetic field of the magnet and are supplied with the second current through them. Thus, the magnet is angularly positioned in accordance with the magnitudes and directions of said first and second currents, thereby causing the pointer to indicate the angular position of the magnet.

9 Claims, 16 Drawing Sheets

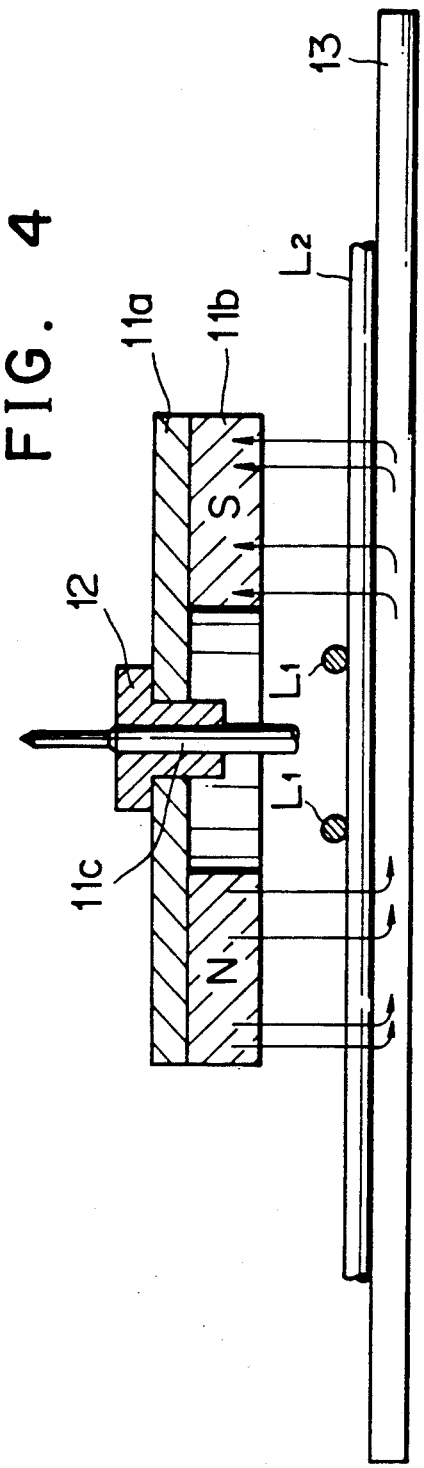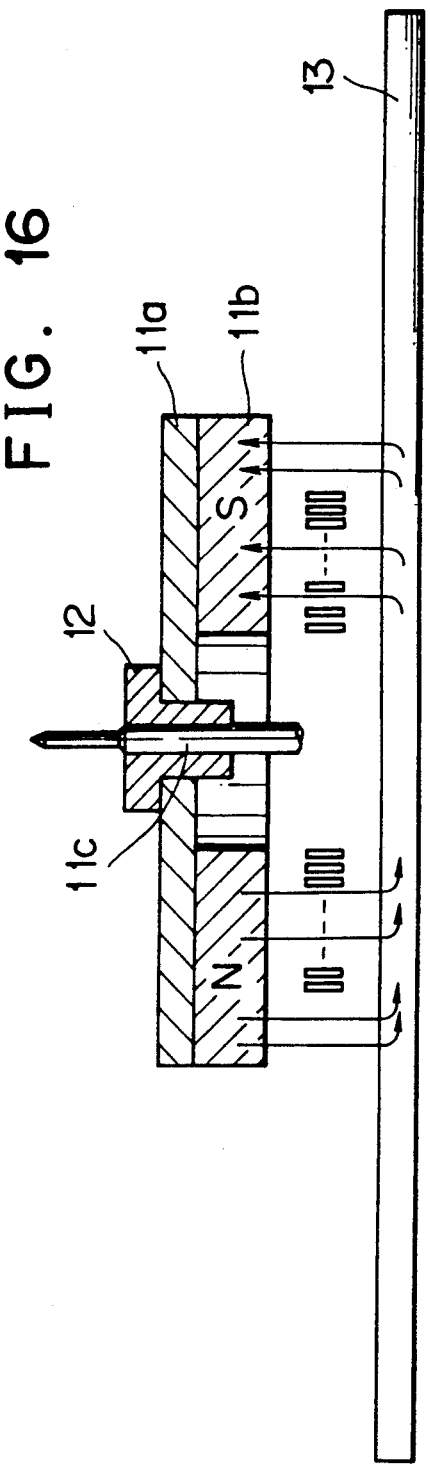

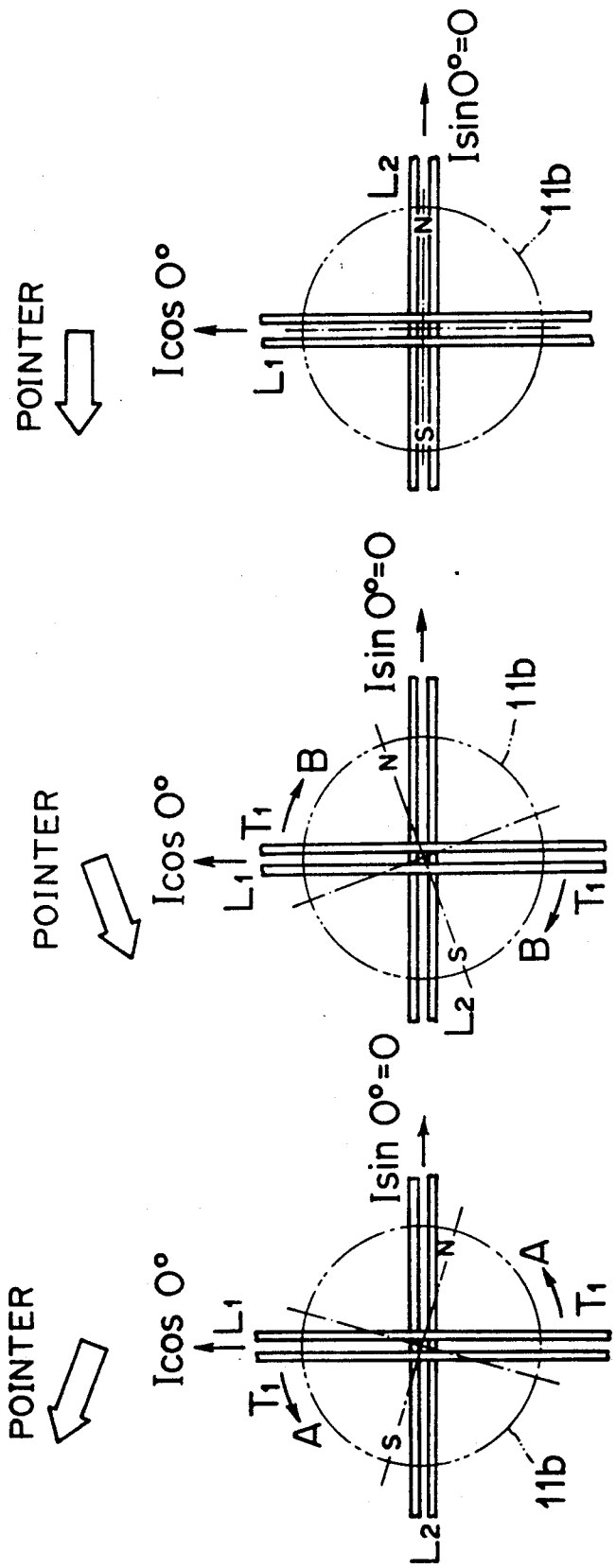

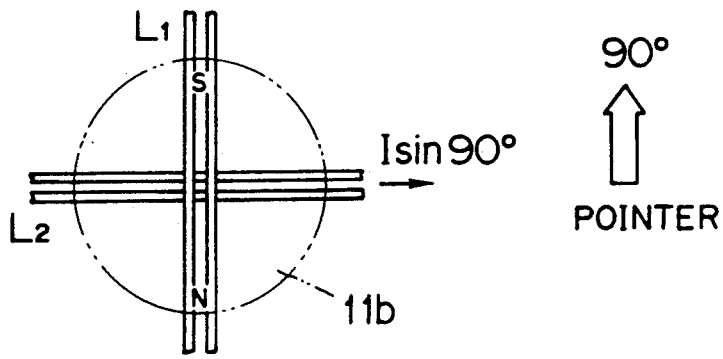
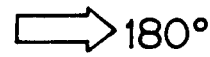
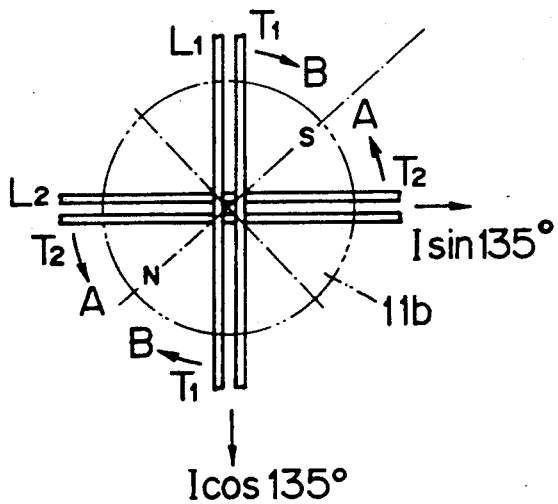
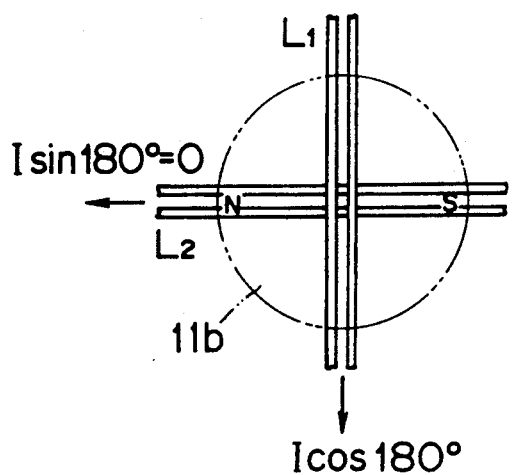

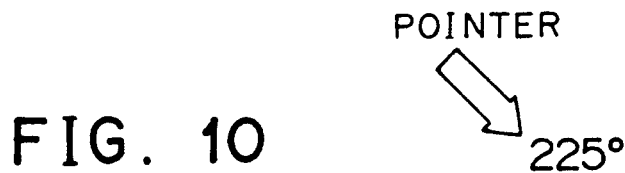
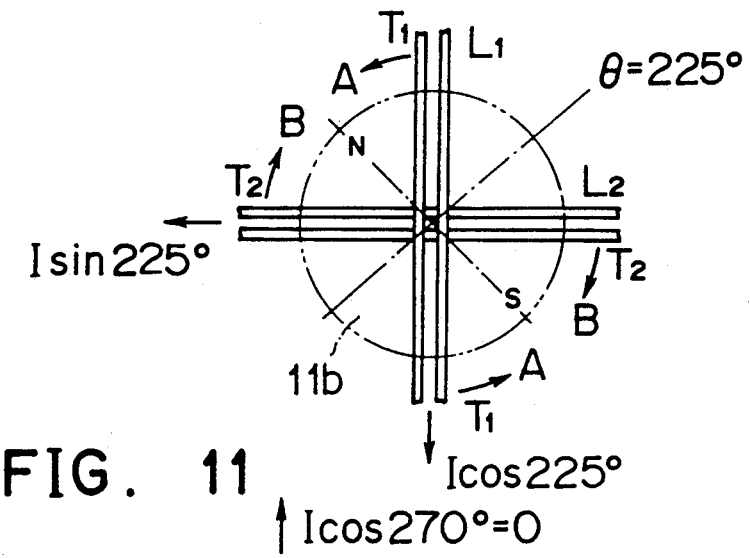
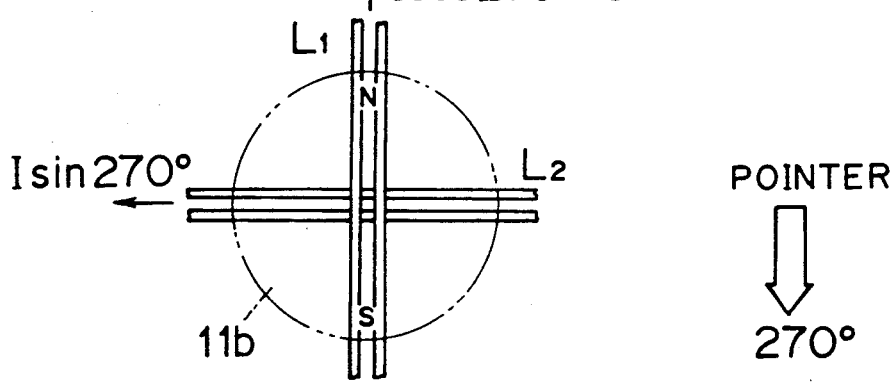
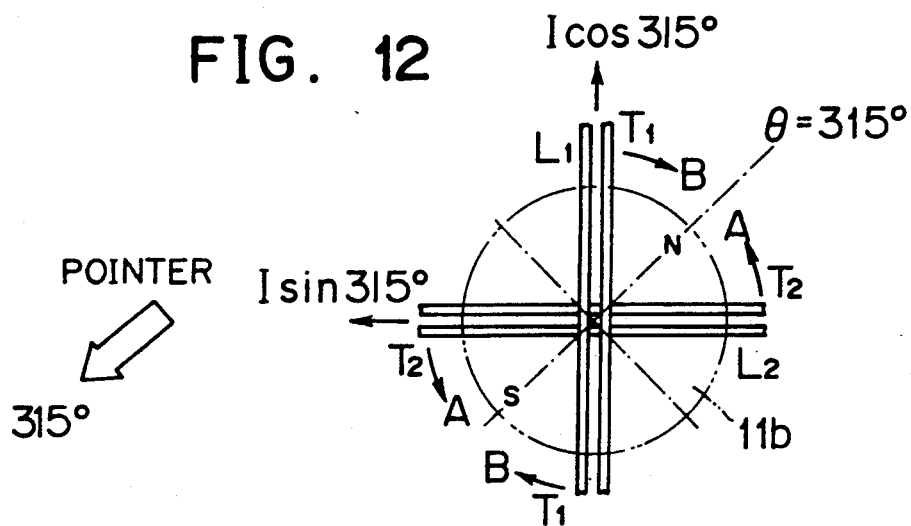

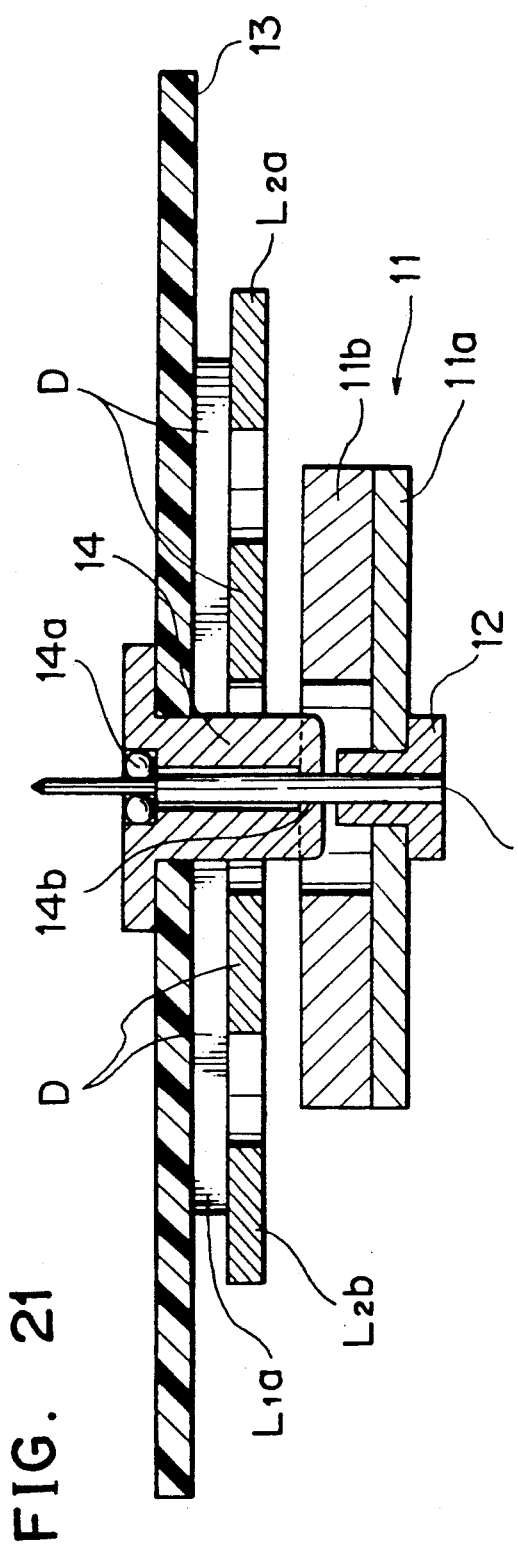
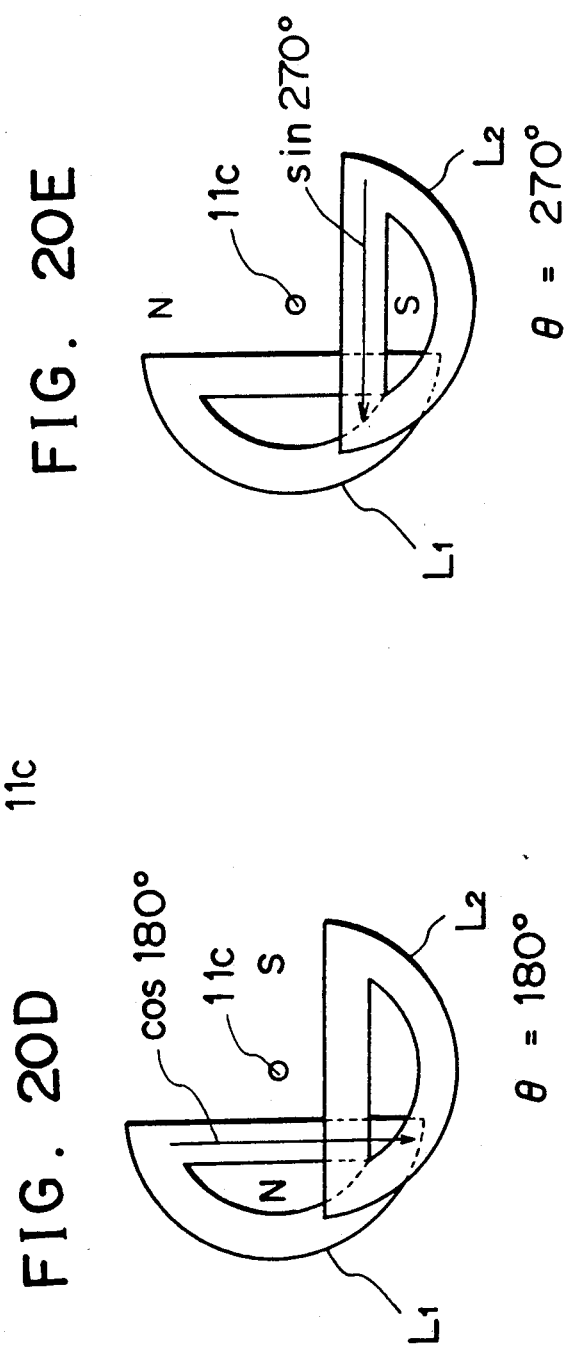

MOVEMENT FOR AN INSTRUMENT HAVING AN ELECTROMAGNETIC CONTROL ARRANGEMENT

BACKGROUND OF THE INVENTION

1. Field of the Invention

The present invention relates to a movement for on-vehicle instruments such as a speedometer, a tachometer, a water thermometer, and a fuel meter in which a rotor is angularly positioned by a current, which flows through a pair of coils in accordance with a quantity to be measured, such that the pointer mounted to the rotor indicates the magnitude of the quantity to be measured.

2. Prior Art

FIGS. 22 and 23 illustrate one such conventional movement for on-vehicle instruments.

This type of movement is referred to as a cross-coil type in which the cross-coil is formed of a first coil L1 and a second coil L2 which are wound around a bobbin B in multi-layer construction such that the two coils are positioned orthogonal to each other. A rotor Mg in the form of a permanent magnet is located in a space S within the bobbin B where the coils L1 and L2 provide a magnetic field. The rotor Mg is rotatable about a shaft R. The bobbin B is provided with terminals T at the bottom thereof for securing the bobbin B to a printed circuit board. A pointer A attached to the rotational shaft R as shown in FIGS. 24-25 cooperates with a scale plate P, thereby forming an instrument.

When a voltage Vo cos $\theta$ as shown in FIG. 26 is applied to the first coil L1 and a voltage Vo sin $\theta$ as shown in FIG. 26 is applied to the second coil L2, currents through the respective coils set up a magnetic field. The magnetic fields H1 and H2 generated by the coils L1 and L2, respectively, are orthogonal to each other as shown in FIG. 27 and produce a resultant magnetic field H. The direction of the resultant magnetic field is $\theta$ since the magnitudes of the respective fields H1 and H2 are proportional to Vo cos $\theta$ and Vo sin $\theta$, respectively. Therefore, when an angle is a quantity to be measured, the angular position of the resultant filed H is a direct indication of the quantity to be measured. The direction of the resultant field H is indicated by means of the pointer A mounted to the shaft R on the rotor Mg which is angularly driven by the resultant field H.

The cross coil L of the conventional movement for an instrument is constructed of a pair of coils L1 and L2 which are wound one over the other. This construction requires a bobbin B on which the coils L1 and L2 are provided and therefore the entire movement will be clumsy, causing the problem that the overall size of the movement cannot be thin enough. Since the on-vehicle instruments are generally mounted in a rather limited space such as the dash board in front of the driver, the thick and bulky structure of the conventional movements is not really space saving.

SUMMARY OF THE INVENTION

An object of the present invention is to provide a movement for an instrument of thin construction. According to the invention, a rotatably supported shaft extends through a thin magnet and supports the magnet thereon. The magnet radiates a magnetic field that varies in magnetic field strength in accordance with a sine function along a circular path about the shaft. A signal generator provides a first current and a second current. First straight conductors are disposed in a first direction parallel to the surface of the thin magnet, are laid in the magnetic field of the magnet, and are supplied with the first current therethrough. Second straight conductors are disposed in a second direction parallel to the surface of the magnet and transverse to the first direction. The second conductor are laid in the magnetic field of the magnet and are supplied with the second current therethrough. Thus, the magnet is angularly positioned in accordance with the magnitudes and directions of said first and second currents, thereby causing the pointer to indicate the angular position of the magnet.

BRIEF DESCRIPTION OF THE DRAWINGS

Features and other objects of the invention will be more apparent from the description of the preferred embodiments with reference to the accompanying drawings in which:

FIG. 4 shows a magnetic path of the first embodiment provided by a magnetic printed board 13 for the magnetic flux from the permanent magnet 11b;

FIGS. 5A-5C show how the rotor is positioned at 0-degree position thereof;

FIGS. 7A-7D show how the rotor is positioned at 90 degree position thereof;

FIGS. 8-12 show major discrete angles of 135, 180, 225, 270, and 315 degrees at which the rotor is positioned;

FIG. 16 shows a magnetic path of the second embodiment provided by a magnetic printed board 13 for the magnetic flux from the permanent magnet 11b;

FIGS. 20A-20E illustrate the direction of current that flows through one of two halves of the respective pair of coils of the second embodiment;

FIG. 21 is a vertical cross-sectional view of a modified second embodiment in which the magnetic board 13 and a rotor 11 are positioned with, their positions being different from FIG. 14;

DETAILED DESCRIPTION OF THE EMBODIMENTS

First Embodiment

Figure 1:
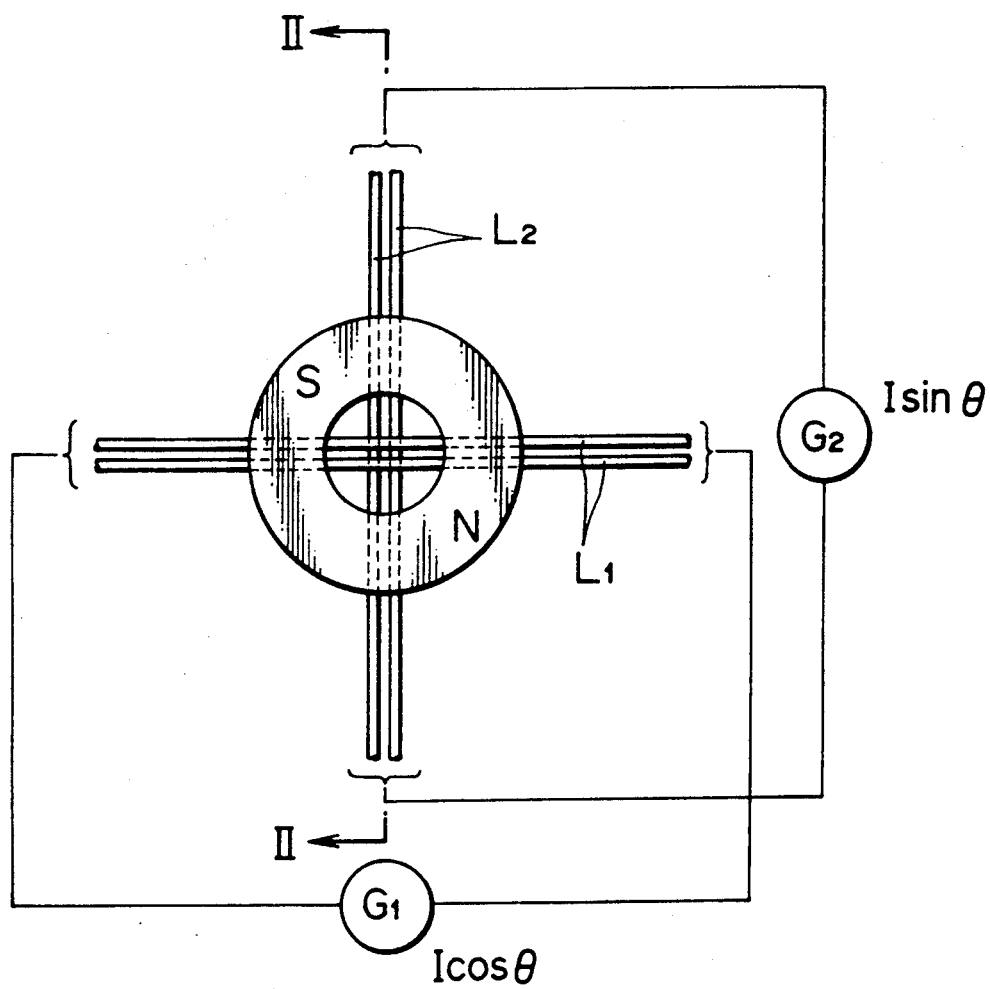
FIG. 1 is a top view of a first embodiment of a movement according to the present invention.
Figure 2A:
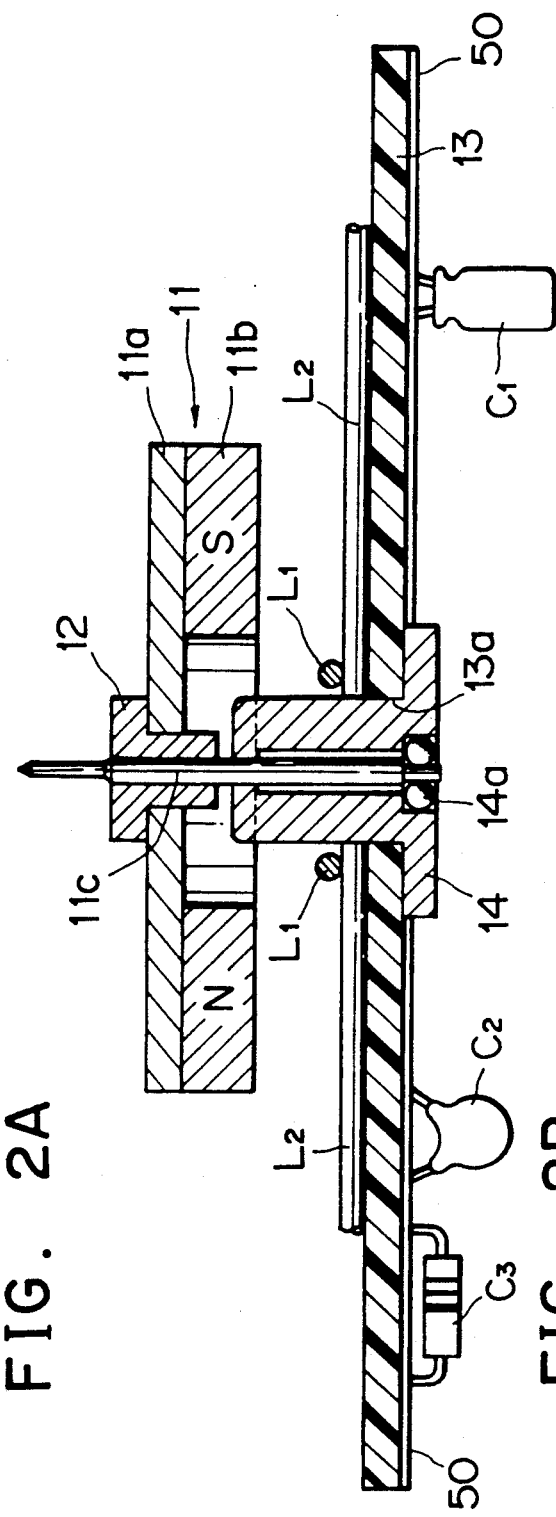
FIG. 2A is a vertical cross-sectional view taken along the lines II—II in FIG. 1.
Figure 2B:
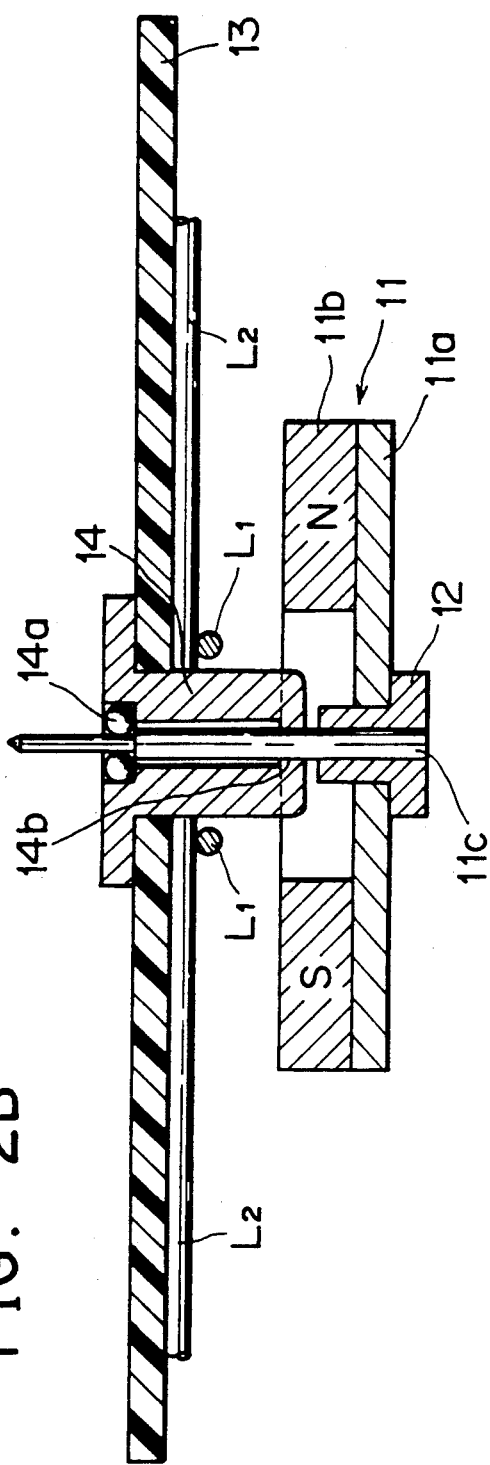
FIG. 2B is a vertical cross-sectional view of a modified first embodiment in which a magnetic board 13 and a rotor 11 are positioned, their positions being different from FIG. 2A.
Figure 3:
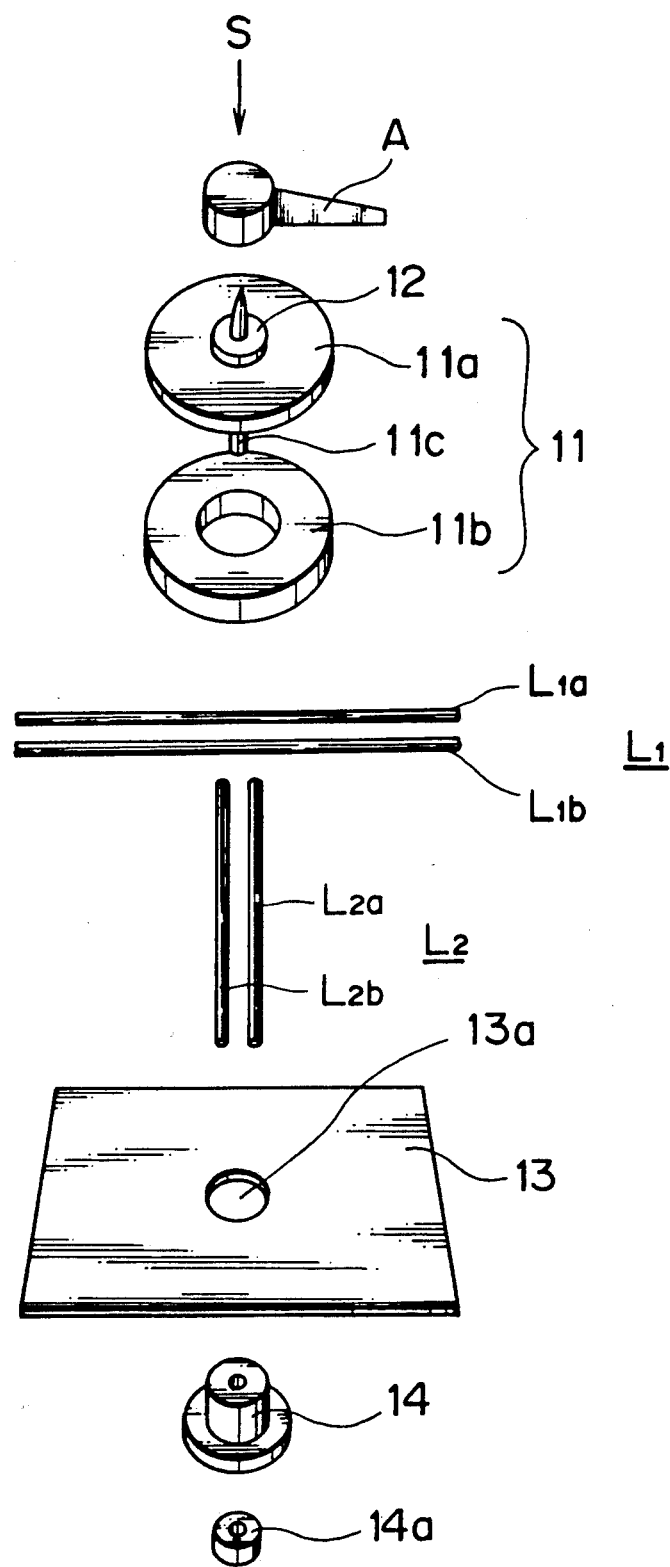
FIG. 3 is an exploded perspective view of the first embodiment in FIG. 1.

A first embodiment will now be described in detail referring to the drawings. FIGS. 1-3 illustrate a first embodiment of a movement for an instrument according to the present invention. FIG. 1 is a top view of the movement; FIG. 2A is a vertical cross-sectional view; and FIG. 3 is an exploded perspective view.

Referring to FIG. 3, a printed circuit board 13 is formed with a hole 13a therein through which a rotating shaft 11c loosely extends. A first group of conductors L1 is fixed to the board 13 by means of an adhesive bond and has two parallel conductors L1a and L1b which are disposed with the hole 13a therebetween. Each of the two conductors L1a and L1b extends in a first direction substantially passing through the hole 13a. A second group of conductors L2 is also fixed to the board 13 by means of the adhesive bond and has two parallel conductors L2a and L2b with the hole 13a therebetween. The number of the conductors for the respective pairs of coils is not limited to two. Each of the two conductors L2a and L2b extends in a second direction substantially passing through the hole 13a. The first direction makes an angle of 90 degrees relative to the first direction.

A rotor 11 is formed of a two-pole permanent magnet 11b, a yoke 11a and a rotating shaft 11c. The permanent magnet 11b is secured on one surface thereof to the yoke 11a. The rotating shaft 11c extends through the yoke 11a and the center hole in the magnet 11b, and is then secured to the yoke at a boss 12.

The disk-shaped rotor 11 is in parallel to the first and second groups of conductors. Each end of the conductors L1a and L1b is soldered to a printed circuit on the board 13 which is connected to a later described oscillator G1. Each end of the conductors L2a and L2b is also soldered to a printed circuit on the board 13 which is connected to a later described oscillator G2.

Figure 17B:
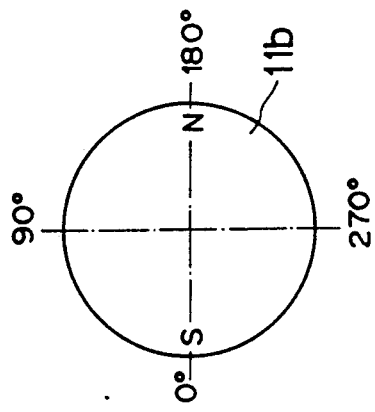
FIGS. 17A and 17B show a permanent magnet magnetized by two poles N and S such that the intensity of magnetic field of each pole varies in accordance with a sine function along the circumference of the magnet.
Figure 17A:
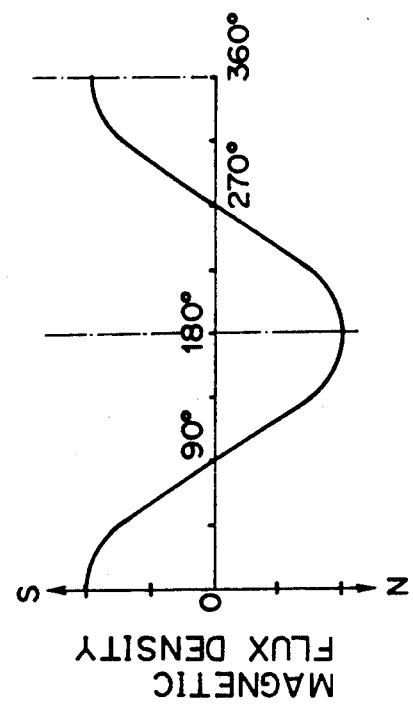

The conductors L1a, L1b, L2a, and L2b are in the form of a straight conductor that diametrically extends below the disk-shaped magnet. A sleeve 14 is inserted into the hole 13 and is secured to the board 13. The rotating shaft 11c loosely extends through the sleeve 14 and is rotatably supported by a bearing 14a which is fitted into the sleeve 14. Thus, the permanent magnet 11b of the rotor 11 and the coils L1 and L2 oppose each other with a narrow air gap therebetween. The permanent magnet 11b shown in FIG. 17B is magnetized as shown in FIG. 17A by two poles N and S such that the magnetic flux density of magnetic field of each pole when measured with respect to a circular or polar coordinate system as shown in FIG. 17B, varies sinusoidally. The magnetization of the permanent magnet 11b accordingly varies as a sine function along the circumference of the magnet 11b. The board 13 is preferably made of a magnetic material with the surface thereof being covered by an insulating film 50 on which the printed circuits C1-C3 associated with the coils is constructed, as shown in FIG. 2A. The magnetic material of the board 13 provides a magnetic path such that the magnetic flux emitted from the permanent magnet 11b effectively cuts through the coils L1 and L2 as shown in FIG. 4. The board 13 may also be made by putting together a conventional non-metal printed circuit board and a sheet of metal of a magnetic material. The straight conductors L1a, L1b, L2a, and L2b are substantially equal to or longer than the diameter of the permanent magnet 11b as shown in FIG. 1.

The conductor L1 is connected to an oscillator G1 which generates a signal indicative of the cosine function of a quantity to be measured, and the conductor L2 is connected to an oscillator G2 which generates a signal indicative of the sine function of the quantity to be measured.

Figure 18:
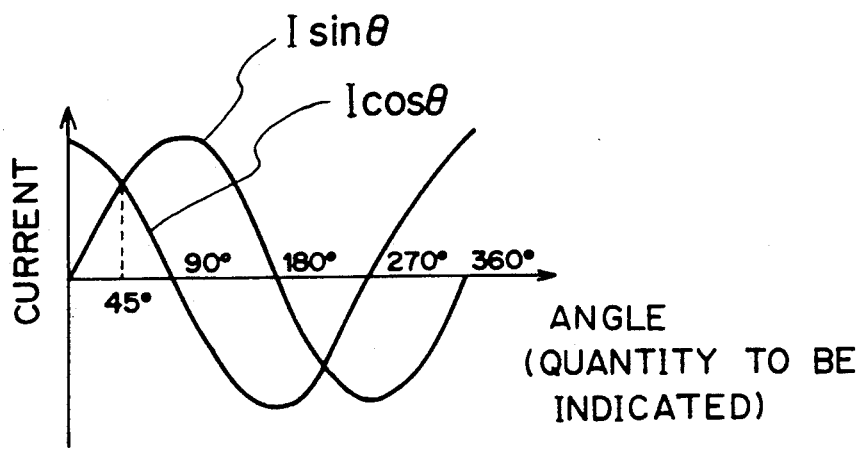
FIG. 18 shows a current I cos $\theta$ and a current I sin $\theta$.
Figure 19:
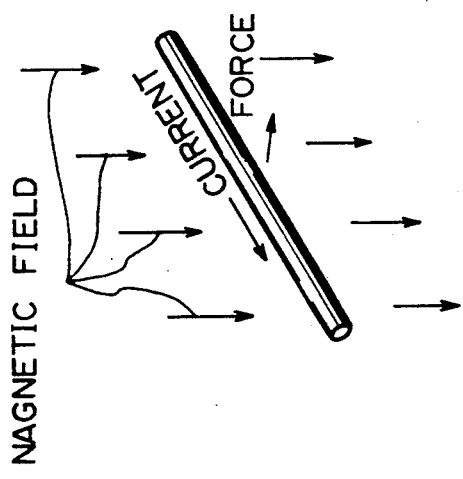
FIG. 19 shows Fleming's left-hand rule.
Figure 20A:
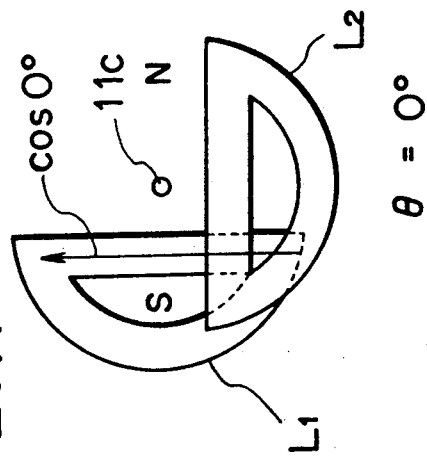
Figure 22:
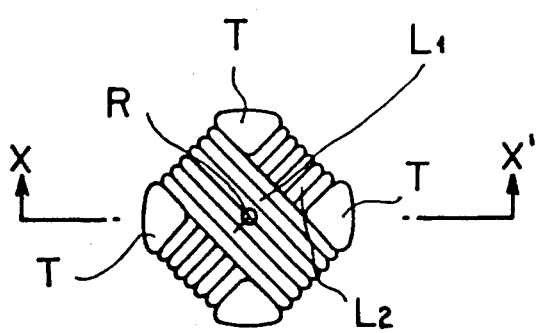
FIGS. 22 and 23 illustrate one conventional movement for on-vehicle instruments.
Figure 23:
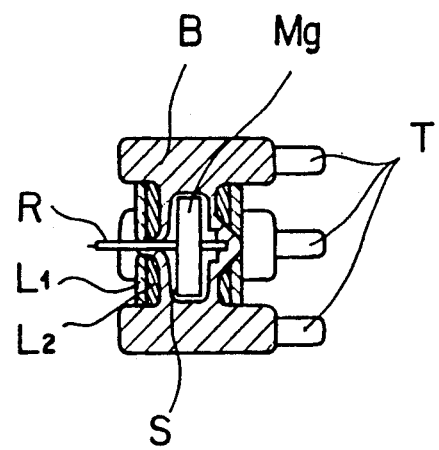
Figure 24:
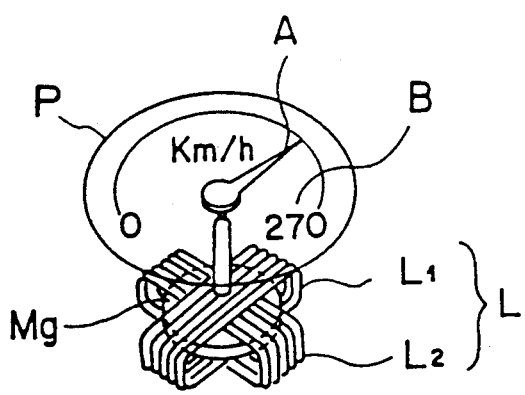
FIGS. 24-25 show a pointer A attached to the rotational shaft R of the conventional movement in FIGS. 22-23.
Figure 25:
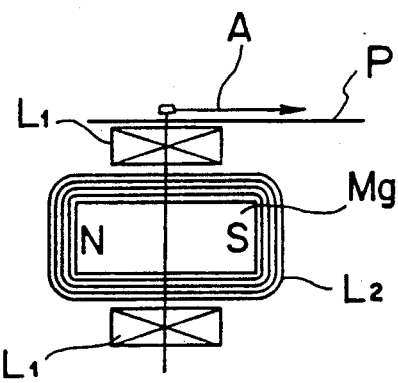
Figure 27:
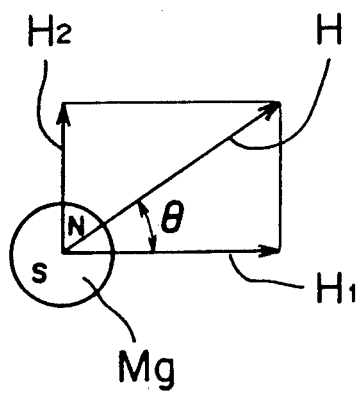
FIG. 27 shows the magnetic fields H1 and H2 generated by the coils L1 and L2, respectively, and the resultant magnetic field H in FIG. 22.
Figure 26:
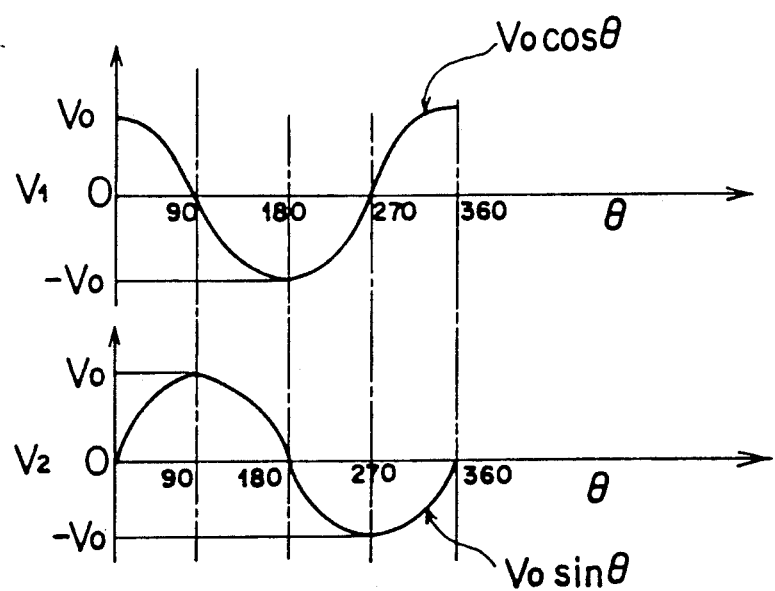
FIG. 26 shows a voltage Vo cos $\theta$ as applied to the second coil L2 in FIG. 22 and a voltage Vo sin $\theta$ as applied to the first coil L1 in FIG. 22.

Assuming that $\theta$ is the magnitude of a quantity to be measured, when a current of I cos $\theta$ as shown in FIG. 18 is supplied from the oscillator G1 to the coil L1, and a current of I sin $\theta$ as shown in FIG. 18 is supplied from the oscillator G2 to the coil L2, Fleming's left-hand rule produces a repulsive force between the conductors and the rotor as shown in FIG. 19, causing the rotor 11 to rotate. From Fleming's left-hand rule, when a current I cos $\theta$ flows through the conductors L1, a torque T1 acting on the rotor 11 is given by $$T1 = n1\{(B1 \sin \theta)(I \cos \theta)/1\}r1$$

where n1 is the number of conductors, B1 is a peak magnetic flux density, I is a peak current, $\theta$ is the angular position of a pointer, I cos $\theta$ is the current through each conductor for the angle $\theta$, and l is the effective length of the conductors, and r is the effective radius of the rotor.

When the conductors L2 is applied a current I sin $\theta$, a torque T2 acting on the coil L2 is given by $$T2 = -n2\{(B2 \cos \theta)(I \sin \theta)/2\}r2$$

The rotor 11 is rotated by the resultant torque of T1 and T2 to an angular position. Thus, the rotor 11 is held at that angular position, i.e. $\theta$.

The pointer A may be angularly oriented from 0 to 360 degrees in a linear relation as shown in FIGS. 5-12 by changing the direction of the currents flowing through the conductors L1 and L2 and continuously varying the magnitude of the currents. For illustrations in FIGS. 5-12, the conductors L1 and L2 and the permanent magnet 11b are seen in the direction of arrow S in FIG. 3.

FIG. 5C shows an angular position of the magnet 11b where the magnet 11b thus the pointer A points to "0" degrees. If the magnet 11b is slightly over-rotated clockwise as shown in FIG. 5A, then the current I cos $\theta$ develops the torque T1 that tends to rotate the magnet 11b in the direction of arrow A. If the magnet 11b is slightly over-rotated counterclockwise as shown in FIG. 5B, then the current I cos $\theta$ develops the torque T1 that tends to rotate the magnet 11b in the direction of arrow B. Therefore, the magnet 11b thus the pointer A is positioned as shown in FIG. 5C.

Figure 6A:
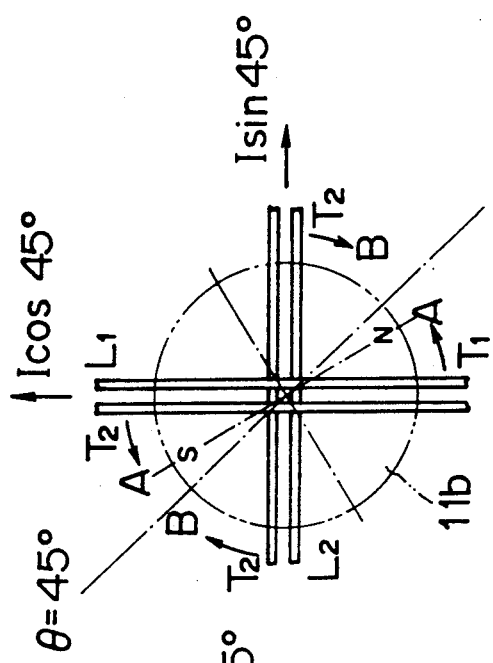
FIGS. 6A-6D show how the rotor is positioned at 45-degree position thereof.
Figure 6B:
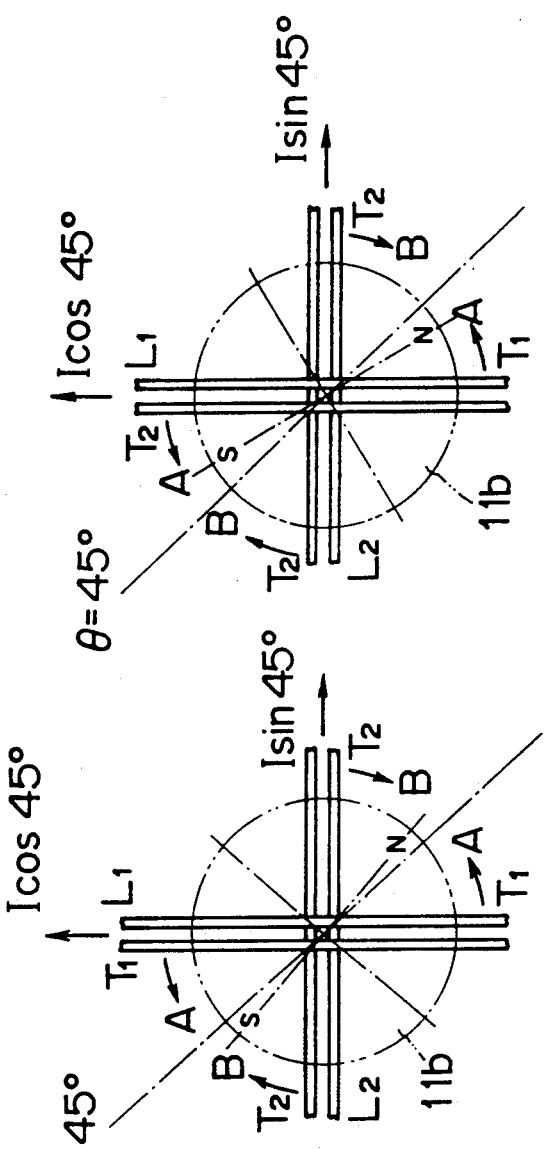
Figure 6C:
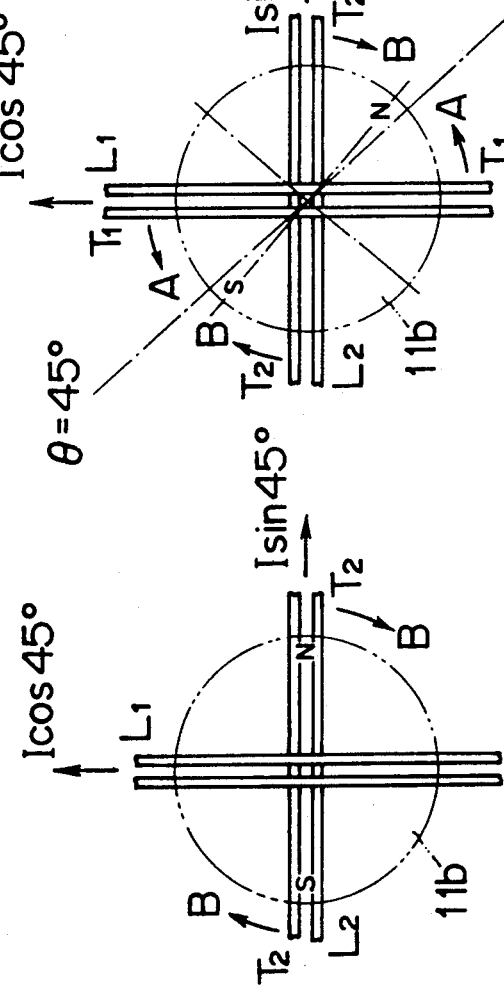
Figure 6D:
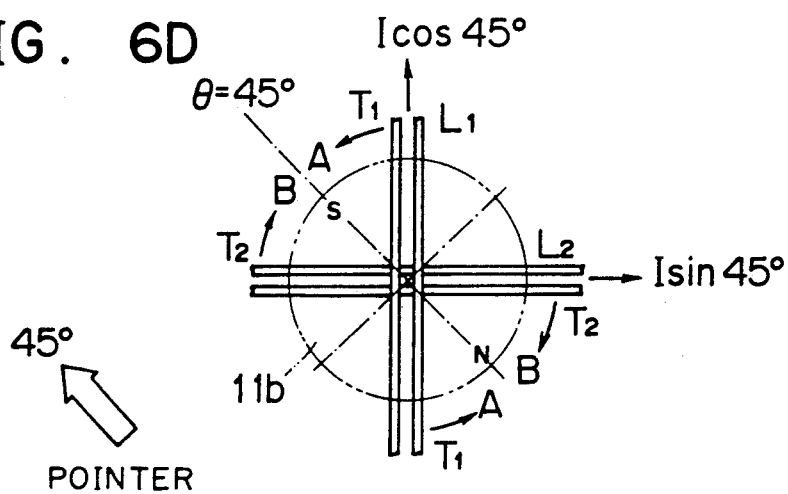

FIG. 6D shows an angular position of the magnet 11b where the two torques T1 and T2 are of the same magnitude and of an opposite direction and the magnet 11b thus the pointer A points to "45" degrees. When a current of I cos 45° is run through the conductors L1 and a current of I sin 45° through the conductors L2, I cos 45° causes a decrease in T1 and I sin 45° gives rise to T2. Thus, the magnet 11b starts to rotate in the direction B from its "0" degree position toward "45 degree" position as shown in FIG. 6A. In FIG. 6D, the magnitude of torques in the direction A is the same as that of the torques in the direction of B. If the magnet 11b is slightly over-rotated clockwise as shown in FIG. 6C, then the currents through the conductors L1 develop a larger torque T1 than that developed by the currents through the conductors L2, causing the magnet 11b to rotate in the direction A. If the magnet 11b is slightly before its 45 degree position as shown in FIG. 6B, then the current through the conductors L2 develop a torque T2 larger than that developed by the conductors L1, causing the magnet 11b to rotate in the direction B. The magnet 11b thus the pointer A is positioned as shown in FIG. 6D.

Varying the magnitudes of the currents through the conductors L1 and L2 will position the magnet thus the pointer A to angles between 0 to 45 degrees.

Figure 7A:
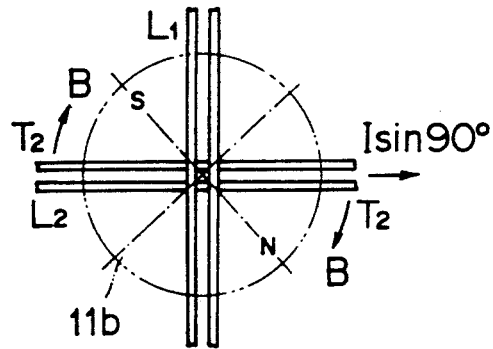
Figure 7B:
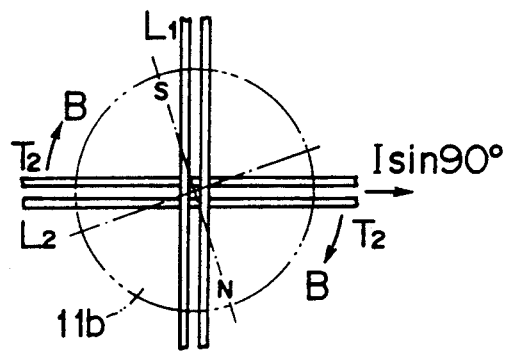
Figure 7C:
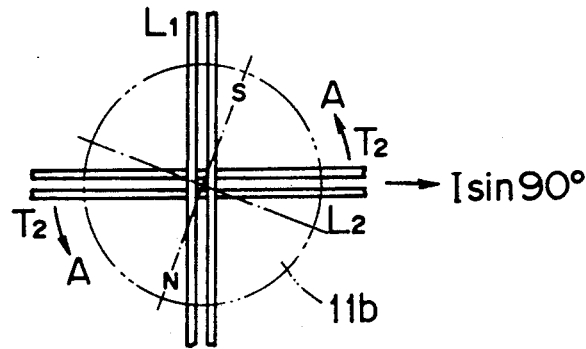

FIG. 7D shows an angular position of the magnet 11b where the magnet 11b or pointer A points to "90" degrees. When a current of I cos 90° is run through the conductors L1 and a current of I sin 90° through the conductors L2, I cos 90° causes T1 to further decrease to zero and I sin 90° causes T2 to further increase to its maximum magnitude. Thus, the magnet 11b starts to rotate in the direction B from its 45-degree position toward 90-degree position as shown in FIG. 7A. If the magnet 11b is slightly over-rotated clockwise as shown in FIG. 7C, then the current through the conductors L2 develop a torque T2 in the direction A, causing the magnet 11b to rotate in the direction A. If the magnet 11b is slightly before its 45 degree position as shown in FIG. 7B, then the current through the conductors L2 develop a torque T2 in the direction B causing the magnet 11b to rotate in the direction B. The magnet 11b thus the pointer A is positioned and stays at 90 degree position as shown in FIG. 7D.

Likewise, the magnet 11b is positioned as shown in FIGS. 8-12 for major discrete angles of 135, 180, 225, 270, and 315 degrees, respectively. For angles between the respective discrete angles, the magnitudes of the respective currents through the conductors L1 and L2 can be varied. In case of power failure, the rotor returns to 0 degree position with the aid of a zero-return mechanism (not shown) such as a small magnet and a return spring.

Second Embodiment

Figure 13:
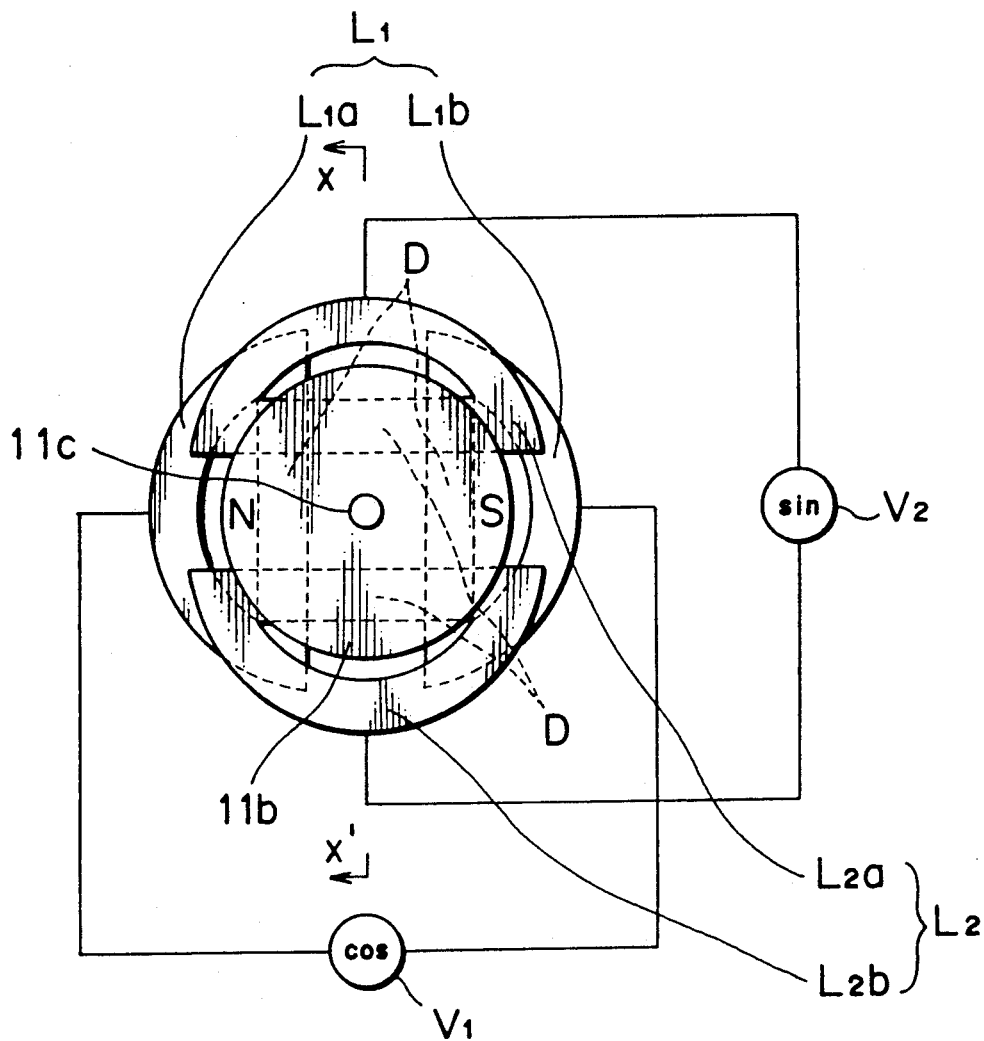
FIG. 13 is a top view of a second embodiment of the movement according to the invention.
Figure 14:
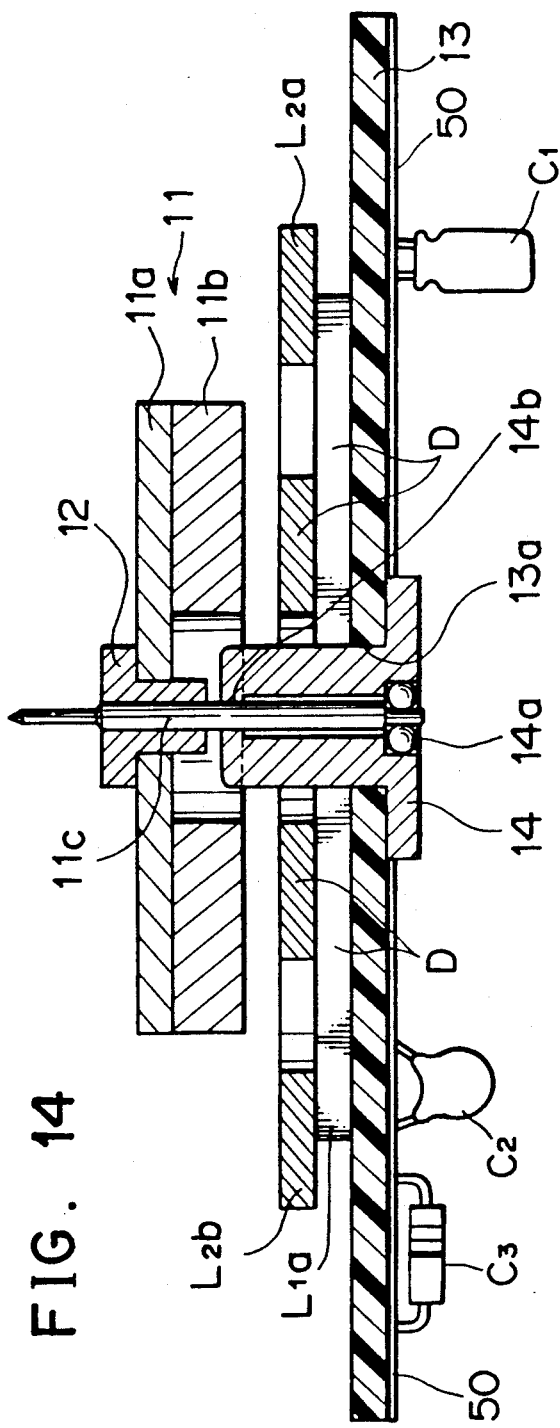
FIG. 14 is a vertical cross-sectional view taken along the lines X—X in FIG. 13.
Figure 15:
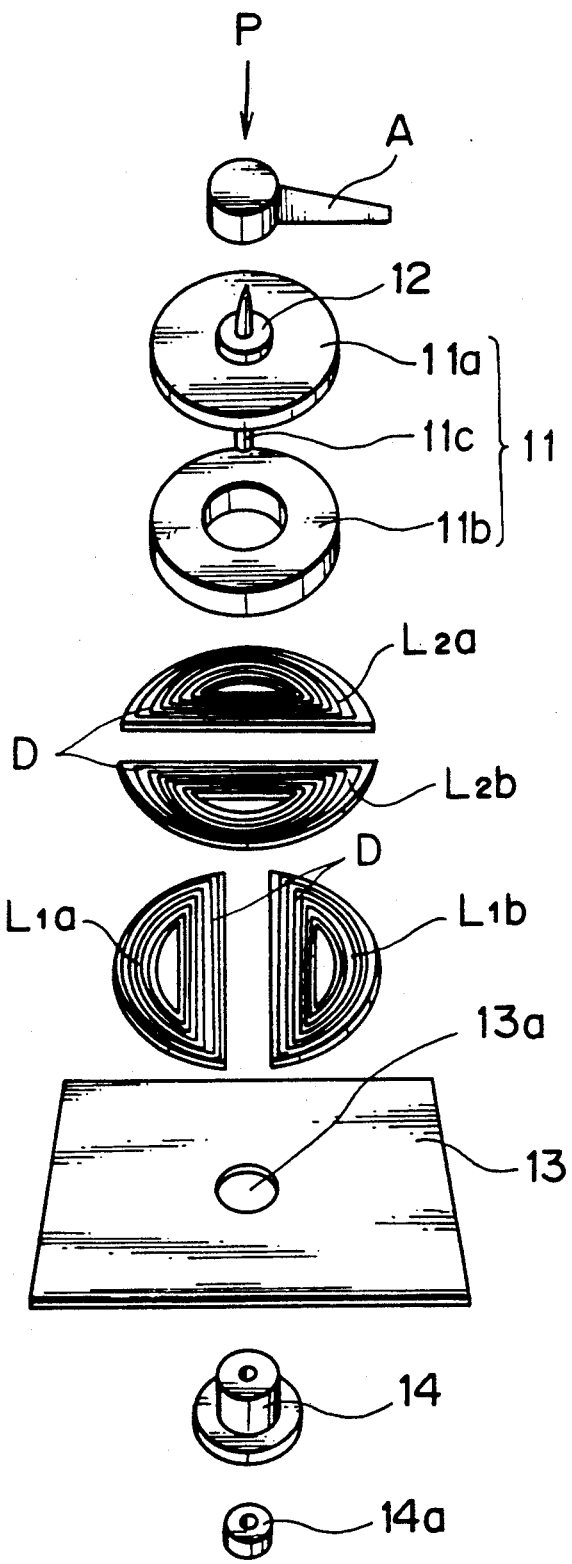
FIG. 15 is an exploded perspective view of the second embodiment.
Figure 20B:
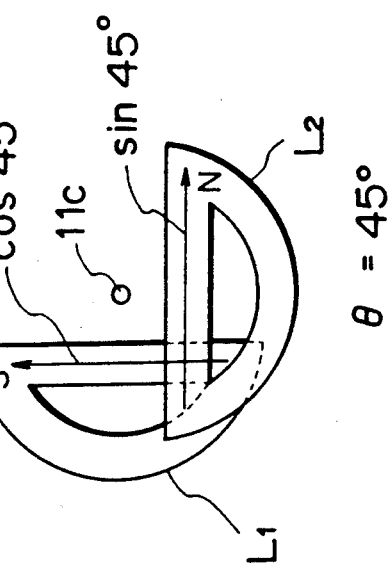
Figure 20C:
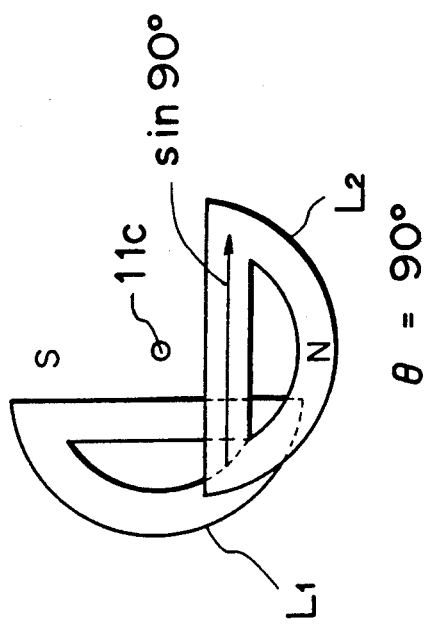

A second embodiment will now be described in detail referring to the drawings. FIGS. 13-15 illustrate a second embodiment of a movement according to the present invention. FIG. 13 is a top view of the movement and FIG. 14 is a vertical cross-sectional view and FIG. 15 is an exploded perspective view.

Referring to FIG. 15, a printed circuit board 13 is formed with a hole 13a therein through which a rotating shaft 11c loosely extends. A first pair of coils L1 is fixed to the board 13 by means of an adhesive bond and has two sub-coils L1a and L1b opposing each other with the hole 13a therebetween. Each of the two sub-coils has straight portions that extend in a first direction. A second pair of coils L2 is also fixed to the board 13 by means of the adhesive bond and has two sub-coils L2a and L2b opposing each other with the hole 13a therebetween. Each of the two sub-coils has straight portions that extend in a second direction which makes an angle of 90 degrees relative to the first direction. It is important that the straight portions of the coils L1 and L2 are exposed to the magnetic field of the magnet 11b but arcuate portions thereof are not. In other words, the arcuate portions serves only a path for the currents flowing through the straight portions.

A rotor 11 is formed of a permanent magnet 11b, a yoke 11a and a rotating shaft 11c. The permanent magnet 11b is secured on one surface thereof to the yoke 11a and is suspended above the flat surface of the first and second pairs of coils. The rotating shaft 11c extends through the yoke 11a and the center hole in the magnet 11b, and is then secured to the yoke at a boss 12.

The disk-shaped rotor 11 is in parallel to the planes in which the first and second pairs of coils are disposed. Each end of wires that form the sub-coils L1a and L1b is soldered to a circuit on the board 13 to be electrically connected in series with each other. Each end of the sub-coils L2a and L2b is also soldered to the circuit on the board to be electrically connected in series with each other.

The sub-coils L1a, L1b, L2a, and L2b are in the form of a toroidal coil which is made by first winding a sheet of copper foil around a mandrel having a cross-section of an arcuate shape to a suitable thickness and then laterally slicing the wound sheet into individual thin generally D-shaped toroidal coils. The surface of the toroidal coils are covered with a film of an insulating material. The toroidal coils L1a and L1b are disposed such that the straight portions of the D-shape oppose each other and extend in a first direction. The toroidal coils L2a and L2b are disposed such that the straight portions of the D-shape oppose each other and extend in a second direction, 90 degrees with respect to the direction in which the straight portions of the toroidal coils L1a and L1b extend. A sleeve 14 is inserted into the hole 13 and is secured to the board 13. The rotating shaft 11c loosely extends through the sleeve 14 and is rotatably supported by a bearing 14a which is fitted into the sleeve 14. Thus, the permanent magnet 11b of the rotor 11 opposes the coils L1 and L2 with a narrow air gap therebetween. The permanent magnet 11b is magnetized by two poles N and S such that the intensity of magnetic field of each pole varies in accordance with a sine function along the circumference of the magnet 11b as shown in FIG. 17. The board 13 is preferably made of a magnetic material with the surface thereof being covered by an insulating film. A printed circuit C1-C3 associated with the coils is constructed on the insulating film 50 as shown in FIG. 14. The magnetic material of the board 13 provides a magnetic path such that the magnetic flux emitted from the permanent magnet 11b effectively cuts through the coils L1 and L2 as shown in FIG. 16. The board 13 may also be made by putting together a conventional non-metal printed circuit board and a sheet of metal of a magnetic material. The straight portion of the respective D-shaped coils L1a, L1b, L2a, and L2b is substantially equal to or longer than the diameter of the permanent magnet 11b as shown in FIG. 13.

The coil L1 is connected to an oscillator G1 which generates a signal indicative of the cosine function of a quantity to be measured and the coil L2 is connected to an oscillator G2 which generates a signal indicative of the sine function of the quantity to be measured.

Assuming that $\theta$ is a magnitude of a quantity to be measured, when a current I cos $\theta$ is supplied from the oscillator G1 to the coil L1 and a current I sin $\theta$ is supplied from the oscillator G2 to the coil L2, Fleming's left-hand rule produces a force such that the permanent magnet 11b and the straight portions of the coils repel each other. This force causes the rotor to rotate since the coils are stationary.

From Fleming's left-hand rule, when a current I cos θ flows through the coil L1, a torque T1 acting on the coil L1 is given by $$T1 = n1 \cdot t1 \cdot B1 \cdot \sin\theta \cdot I\cos\theta \cdot l1 \cdot r1$$

where n1 is the number of coils, t1 is the turns of each coil, B1 is a peak magnetic flux density, l1 is the effective length of the coil, and r1 is the effective radius of the rotor.

When the coil L2 is applied the signal I cos θ, a torque T2 acting on the coil L2 is given by $$T2 = -n2 \cdot t2 \cdot B2 \cdot \cos\theta \cdot I \cdot \sin\theta \cdot l2 \cdot r2$$

The rotor 11 is rotated by the resultant torque of T1 and T2 to an angular position where the two torques T1 and T2 are of the same magnitude and opposite direction. Then the rotor 11 is held at that position.

Therefore, when both the coil L1 and L2 are formed uniformly, the rotor 11 and thus the pointer A may be rotated with good repeatability to an angular position that corresponds to the magnitude of the quantity to be measured. The pointer may be angularly oriented from 0 to 360 degrees in a linear relation as shown in FIGS. 20A–20E by changing the direction of the current flowing through the coils L1 and L2 as well as continuously varying the magnitude of the current. For the sake of illustration, FIGS. 20A–20E illustrate the direction of the current that flows through one of two halves of the respective pair of coil. For example, in FIG. 20B, a current I cos 45° is allowed to flow through the coil L1a upwardly and a current of I sin 45° through the coil L2a to the right.

What is claimed is:
1. A movement for an instrument, comprising:
   a signal generator for providing a first current and a second current;
   a rotatably supported shaft;
   a pointer mounted to said shaft;
   a thin magnet mounted to said shaft and radiating a magnetic field, said shaft extending through said magnet, said magnetic field sinusoidally varying in magnetic field strength circumferentially along a circular path about said shaft;
   at least one first straight conductor disposed in a first direction parallel to a surface of said magnet, said first conductor extending in the magnetic field of said thin magnet and being supplied with said first current therethrough; and
   at least one second straight conductor disposed in a second direction parallel to the surface of said thin magnet and disposed transversely to said first direction, said second conductor extending in the magnetic field of said thin magnet and being supplied with said second current therethrough; wherein said first and second currents cause said thin magnet to rotate about said shaft in response to the magnitudes and directions of said first and second currents, so that said pointer indicates an angular position of said magnet.

2. A movement for an instrument according to claim 1, wherein said first conductor and second conductor are part of a thin toroidal coil.

3. A movement for an instrument according to claim 1, wherein
   said first current is of a cosine function of the angular position of said magnet and said second current is of a sine function of the angular position of said magnet;
   said first and second straight conductors extend substantially diametrically across said magnet; and
   said magnet is a two-pole permanent magnet having a disk-shaped body.

4. A movement for an instrument according to claim 1, wherein said straight conductors are laid on a magnetic board, said magnetic board providing a magnetic path such that the magnetic field radiated from said magnet effectively cuts through the first and second conductors.

5. A movement for an instrument according to claim 4, wherein said magnetic board is covered by an insulating film thereon, and an electrical printed circuit associated with said straight conductors is constructed on the insulating film.

6. A movement for an instrument, comprising:
   a signal generator for providing a first current and a second current;
   a rotatably supported shaft;
   a pointer mounted to said shaft;
   a thin magnet mounted to said shaft and radiating a magnetic field, said shaft extending through said magnet, said magnetic field sinusoidally varying in magnetic field strength circumferentially along a circular path about said shaft;
   at least one first conductor having a D-shaped plate-like body disposed in a first direction parallel to a surface of said magnet, said first conductor extending in the magnetic field of said thin magnet and being supplied with said first current therethrough; and
   at least one second conductor having a D-shaped plate-like body disposed in a second direction parallel to the surface of said thin magnet and disposed transversely to said first direction, said second conductor extending in the magnetic field of said thin magnet and being supplied with said second current therethrough; wherein said first and second currents cause said thin magnet to rotate about said shaft in response to the magnitudes and directions of said first and second currents, so that said pointer indicates an angular position of the magnet.

7. A movement for an instrument as claimed in claim 6, wherein said first conductor is one of a first pair of conductors which each have a D-shaped plate-like body arranged in diametric opposition to each other relative to said shaft, and said at least one second conductor is one of a second pair of conductors which each have a D-shaped plate-like body arranged diametrically opposite to each other relative to said shaft.

8. A movement for an instrument as claimed in claim 7, wherein a first line connecting said first pair of conductors is aligned transversely to a second line connecting said second pair of conductors.

9. A movement for an instrument as claimed in claim 6, wherein said first conductor comprises a sheet-like member having an annular segment portion and a straight portion, said straight portion connecting two ends of said annular segment portion, thereby forming said D-shaped sheet-like body.

* * * * *